(12) United States Patent
Huang et al.

(10) Patent No.: US 6,833,325 B2
(45) Date of Patent: Dec. 21, 2004

(54) METHOD FOR PLASMA ETCHING PERFORMANCE ENHANCEMENT

(75) Inventors: Zhisong Huang, Fremont, CA (US); Lumin Li, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/295,601

(22) Filed: Nov. 14, 2002

(65) Prior Publication Data

US 2004/0072443 A1 Apr. 15, 2004

Related U.S. Application Data

(60) Provisional application No. 60/417,806, filed on Oct. 11, 2002.

(51) Int. Cl.[7] ................... H01L 21/302; H01L 21/461
(52) U.S. Cl. .................. 438/714; 438/718; 438/719; 438/723
(58) Field of Search ................... 438/694, 706, 438/714, 717, 718, 719, 723–725; 216/67–69

(56) References Cited

U.S. PATENT DOCUMENTS

| | | | |
|---|---|---|---|
| 4,795,529 A | 1/1989 | Kawasaki et al. ........... 156/643 |
| 5,498,312 A | 3/1996 | Laermer et al. .......... 156/643.1 |
| 5,501,893 A | 3/1996 | Laermer et al. ............. 428/161 |
| 5,562,801 A | 10/1996 | Nulty ...................... 156/643.1 |
| 5,882,535 A | 3/1999 | Stocks et al. .................. 216/18 |
| 5,942,446 A | 8/1999 | Chen et al. .................. 438/734 |
| 6,025,255 A | 2/2000 | Chen et al. .................. 438/595 |
| 6,074,959 A | 6/2000 | Wang et al. ................. 438/738 |
| 6,127,273 A | 10/2000 | Laermer et al. ............. 438/709 |
| 6,187,685 B1 | 2/2001 | Hopkins et al. ............. 438/710 |
| 6,200,822 B1 | 3/2001 | Becker et al. ................... 438/9 |
| 6,211,092 B1 * | 4/2001 | Tang et al. .................. 438/719 |
| 6,214,161 B1 | 4/2001 | Becker et al. ............... 156/345 |
| 6,261,962 B1 | 7/2001 | Bhardwaj et al. ........... 438/702 |
| 6,284,148 B1 | 9/2001 | Laermer et al. ............... 216/37 |
| 6,303,512 B1 | 10/2001 | Laermer et al. ............. 438/712 |
| 6,316,169 B1 * | 11/2001 | Vahedi et al. ............... 430/329 |
| 6,326,307 B1 | 12/2001 | Lindley et al. .............. 438/689 |
| 6,387,287 B1 * | 5/2002 | Hung et al. ................. 438/714 |
| 6,403,491 B1 | 6/2002 | Liu et al. ..................... 438/710 |
| 6,489,632 B1 * | 12/2002 | Yamazaki et al. ............. 257/66 |
| 6,569,774 B1 | 5/2003 | Trapp .......................... 438/706 |
| 6,617,253 B1 * | 9/2003 | Chu et al. .................... 438/702 |

FOREIGN PATENT DOCUMENTS

| | | | |
|---|---|---|---|
| DE | 10059836 A1 | 6/2002 | ......... H01L/21/311 |
| EP | 0822582 A2 | 2/1998 | ......... H01L/21/306 |
| JP | S63-13334 | 1/1988 | ......... H01L/21/302 |
| JP | 07226397 | 8/1995 | ....... H01L/21/3065 |
| JP | 2001068462 | 3/2001 | ....... H01L/21/3065 |
| WO | WO 00/30168 | 5/2000 | ......... H01L/21/311 |

OTHER PUBLICATIONS

U.S. patent application No. 10/411,520, File Date: Apr. 9, 2003.

International Search Report, dated Feb. 24, 2004.

* cited by examiner

*Primary Examiner*—Duy-Vu Deo
(74) *Attorney, Agent, or Firm*—Beyer Weaver & Thomas LLP

(57) ABSTRACT

A method for etching a feature in a layer through an etching mask is provided. A protective layer is formed on exposed surfaces of the etching mask and vertical sidewalls of the feature with a passivation gas mixture. The feature is etched through the etching mask with reactive etching mixtures containing at least one etching chemical and at least one passivation chemical.

20 Claims, 7 Drawing Sheets

METHOD FOR PLASMA ETCHING PERFORMANCE ENHANCEMENT

RELATED APPLICATIONS

This application claims priority under 35 USC 119(e) from the Provisional Application No. 60/417,806 entitled "IN-SITU PLASMA VAPOR DEPOSITION AND ETCH METHOD FOR PLASMA ETCH PERFORMANCE ENHANCEMENT," which was filed on Oct. 11, 2002, hereby incorporated by reference.

BACKGROUND OF THE INVENTION

1. Field of the Invention

The invention relates to a method of obtaining a structure on a semiconductor wafer by etching through structures defined by an etch mask using a plasma.

2. Description of the Related Art

In semiconductor plasma etching applications, a plasma etcher is usually used to transfer a photoresist mask pattern into a circuit and line pattern of a desired thin film and/or filmstack (conductors or dielectric insulators) on a Si wafer. This is achieved by etching away the films (and filmstacks) underneath the photoresist materials in the opened areas of the mask pattern. This etching reaction is initiated by the chemically active species and electrically charged particles (ions) generated by exciting an electric discharge in a reactant mixture contained in a vacuum enclosure also referred to as a reactor chamber. Additionally, the ions are also accelerated towards the wafer materials through an electric field created between the gas mixture and the wafer materials, generating a directional removal of the etching materials along the direction of the ion trajectory in a manner referred to as anisotropic etching. At the finish of the etching sequence, the masking materials are removed by stripping it away, leaving in its place replica of the lateral pattern of the original intended mask patterns. This etching method is illustrated in FIGS. 1A–C. In this method, a plasma etching process is used to transfer directly the photoresist mask pattern 104 into that of the underlying oxide dielectric thin film 108, as shown in FIG. 1A. The etching generates a contact hole 112 and erodes and damages the photoresist 104, as shown in FIG. 1B. The photoresist is then removed leaving the contact hole 112 in the oxide 108, as shown in FIG. 1C. During the etching process, the mask materials are usually eroded and/or damaged in exchange for the pattern transfer. Consequently, some of the damage and erosion also may be transferred to the underlying layers leaving such undesirable pattern distortions such as striation, CD enlargement, etc.

The objective of the etching methodology, therefore, includes reducing the photoresist mask erosion to enhance the fidelity of the pattern transfer from the photoresist mask patterns. For this purpose, it has been proposed to include a passivation gas in the reactive etching mixture. This passivation gas can be chosen in such a way that its presence selectively reduces the etching damage and erosion of the masking materials relative to the removal rate of the thin film materials to be etched. The passivation gas can be chosen in such a way that, an etching retardation coating is generated on the surface of the masking materials acting as a barrier to slow down the etching reaction. By design, the passivation gas is chosen in a way that it additionally beneficially forms an etching retardation coating on vertical surfaces of the film structures to be etched, such that etching reaction can not advance in the absence of the ion bombardment. By the nature of the vertical trajectory of the charged particles, etching can therefore advance only in the vertical direction, with little to no etching in the lateral direction, creating an anisotropic etching profile. Hence, the presence of a passivation gas in the etching mixture is very important for the advantage of better etching mask protection and highly anisotropic etching profile by the use of relatively high energy directional ion bombardment.

It has already been proposed that the reactive gas mixture contain etching gases and polymer formers, with the latter acting the role of a passivation gas. In this case, the etching gases release highly reactive species by the excitation of an electrical discharge, which in turn etches the thin film materials to be etched as well as the masking materials by the mechanism of a spontaneous reaction. By the nature of spontaneous reactions, the etching reaction advances in both the vertical as well as the lateral surfaces, creating isotropic etching profiles. The co-presence of a polymer former, through generation of a polymer deposit on the surface of the etching structures and masking materials, can be used to create simultaneously high etching selectivity to masking materials and etching anisotropy, in conjunction with the ion bombardment.

It also has already been proposed that the reactive gas mixture contain polymer former gases and an etching enabler gas. The role of the etching enabler gas is to enable the polymer former gas to release highly reactive species by reacting with the polymer former gases in the presence of an electrical discharge. Alternatively, a retardation coating on the etching materials as well as the masking materials can also be formed by chemical reaction of a properly chosen passivation gas directly with the surfaces of these materials.

A common disadvantage of the above mentioned methods is that the optimum conditions for different aspects of the etching requirement usually do not coincide and by mixing the gases some of the unique properties of each precursor gases may be lost due to inter-reactions. The etching condition optimization almost always involve complex trade-offs into a single etching condition that may not be the optimum should the different etching chemistries be separate.

A variant of the etching methodology is taught in U.S. Pat. No. 5,501,893, issued Mar. 26, 1996 to Laermer et al., entitled "Method of Anisotropically Etching Silicon". This method separates out the etching gases and polymer former gases into two different steps, each consisting purely of one type of chemicals but not the other. This allows for fast etching rate at low ion bombardment energies, since at low ion bombardment energies, high selectivities to masking materials can be achieved for certain spontaneous etching reactions if the activation energy is slightly lower for the reaction at the surface of the etching materials than the masking materials. By removing the polymer former from the etching process, on the other hand, the etching. process would necessarily be isotropic during the duration when the etching is proceeding, since there is no retardation layer to prevent the lateral etching from occurring. Additionally, without the passivation gas in the etching mixture, it would be difficult to obtain sufficient etching selectivity to the masking materials if the desire is there to use higher ion energies. Many etching applications can benefit from high ion bombardment energy to obtain high aspect ratio structures in very small dimension structures, for example.

Additional proposed methods include a stacked masking scheme to improve the overall etching resistance of the masking materials. This is illustrated in FIGS. 2A-F. In FIG. 2A an oxide layer 204 is provided. FIG. 2B shows a hardmask layer 208 placed over the oxide layer. A photoresist mask 212 is placed over the hardmask layer 208, as shown in FIG. 2C. The photoresist mask 212 is used to pattern the hardmask layer 208 to create a patterned hardmask layer 214, and the photoresist layer 212 may be removed, as shown in FIG. 2D. A contact hole 216 is etched in the oxide layer 204, using the patterned hardmask layer 214 as a mask as shown in FIG. 2E. The hardmask is then removed leaving the contact 216 in the oxide layer 204, as shown in FIG. 2F.

The advantages of this method are that, by having a more inert hardmask from which to transfer patterns (circuits and lines) to the underlying films, the etch performance is much enhanced and the requirement on the etching and photolithography is also much reduced. The disadvantages of this method are that, by introducing new process steps and new tool sets into the process flow, it is of higher cost and lower overall throughput. In addition, the extra process complexity also introduces difficulties by itself. For example, the Si hardmask used for dielectric contact etch applications is not as easily stripped as the photoresist mask.

The purpose of this invention is to provide a generic method for etching a feature in a layer or a stack of layers to obtain a high fidelity replica of a lateral pattern formed by a masking material with simultaneously high etching anisotropy and high selectivity to the masking materials as well as to the stop layers

SUMMARY OF THE INVENTION

To achieve the foregoing and in accordance with the purpose of the present invention, a method for etching a feature in a layer through an etching mask is provided. A protective layer is formed on exposed surfaces of the etching mask and vertical sidewalls of the feature with a passivation gas mixture. The feature is etched through the etching mask with reactive etching mixtures containing at least one etching chemical and at least one passivation chemical.

In another embodiment of the invention, an apparatus for etching a layer under an etch mask, where the layer is supported by a substrate, is provided. A plasma processing chamber comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure is provided. A deposition gas source and an etchant gas source are provided. A first control valve in fluid connection between the gas inlet of the plasma processing chamber and the deposition gas source and a second control valve in fluid connection between the gas inlet of the plasma processing chamber and the etchant gas source are provided. A controller controllably connected to the first control valve, the second control valve, and the at least one electrode comprising at least one processor and computer readable media is provided. The computer readable media comprises computer readable code for opening the first control valve for at least one deposition step to provide a deposition gas from the deposition gas source to the plasma processing chamber enclosure, computer readable code for closing the second control valve for the at least one deposition step to prevent etching gas from the etching gas source from entering the plasma processing chamber enclosure, computer readable code for opening the second control valve for at least one etching step to provide an etching gas from the etching gas source to the plasma processing chamber, and computer readable code energizing the at least one electrode to provide a bias of greater than 250 volts on the substrate for at least one etching step.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
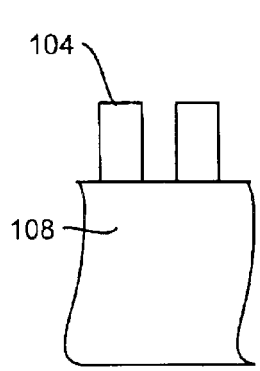
FIGS. 1A–C are schematic views of the formation of a contact hole feature through a prior art process.
Figure 1B:
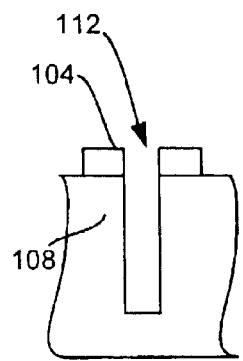
Figure 1C:
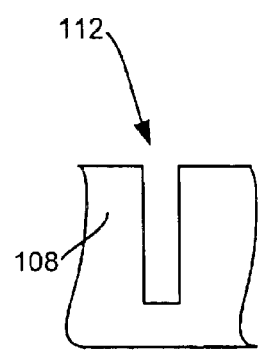
Figure 2A:
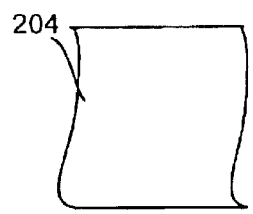
FIGS. 2A–F are schematic views of the formation of a contact hole feature through another prior art process.
Figure 2B:
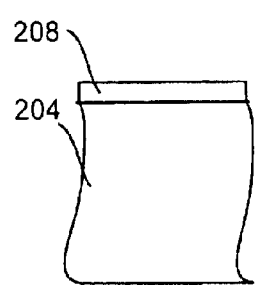
Figure 2C:
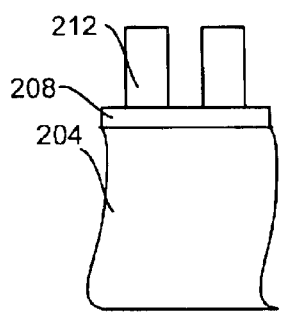
Figure 2D:
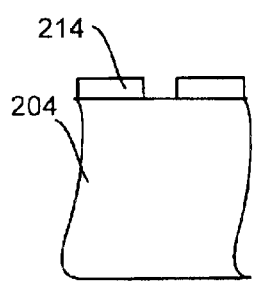
Figure 2E:
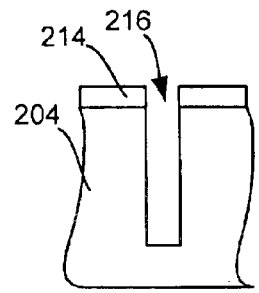
Figure 2F:
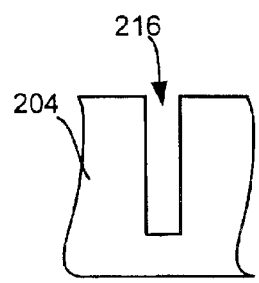

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

The said invention is a new etching method in which an in-situ passivation process is combined and integrated with an etch process to enhance the overall etch performance without unduly sacrificing simplicity and cost-effectiveness.

In this new method, an in-situ plasma chemical process is used to enhance and/or repair the photoresist mask, as well as the vertical sidewalls of etching features, during the etching progression. During this new etch sequence, a plasma chemical process step is initiated for a short duration before and/or after the wafer is exposed to an etching plasma for a desired duration. The plasma passivation process is chosen in such a way that a thin film of material coatings is formed on the mask pattern to protect the mask from later etch erosion. Preferably, this thin coating is of a material that is compatible with later stripping process for ease of final removal but more etch resistant than the mask materials. For example, a carbon-rich thin film, containing very low to no amount of other elements, can be used to coat a photoresist mask so that protected mask features is noteasily eroded by the subsequent etching process. In other words, it changes the surface composition of the mask pattern such that the mask behaves like a pseudo hardmask, having certain beneficial etching characteristics of an amorphous carbon hardmask. Alternatively, the passivation process may also be used in such a way that the formation of the thin coating on the mask pattern largely compensates for and/or repairs the mask patterns damaged/eroded by the prior etch process. The relative inertness of the coating to the subsequent etching reaction is beneficial so as to not to alter the fine balance obtained in the etching step.

The etching gas mixture contains etchant species and at least one passivation species so as to not lose the benefits associated with a passivation gas in the etching chemistry. The ratio of the etching to passivation components, along with a plurality of other processing conditions, is finely balanced to achieve optimum processing results, such as photoresist selectivty, etching anisotropy and etching rate etc. The electrical discharge power is kept high and the energy of the charged particles is also kept high to obtain high etch rate and good etching anisotropy in small dimensional structures. The passivation and etching sequence can be, but may not need to be, reiterated and adjusted until the completion of the etching task.

Figure 3:
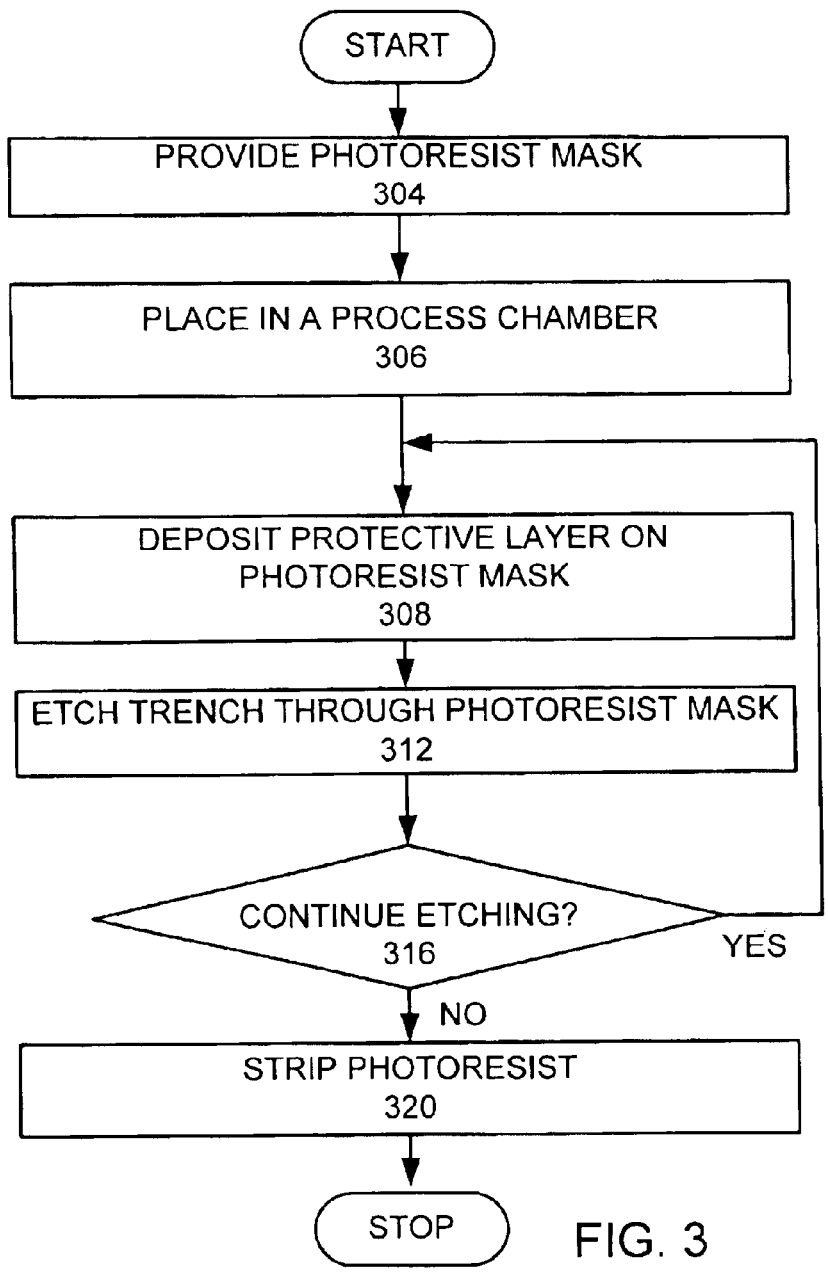
FIG. 3 is a flow chart of an inventive passivation and etch process.
Figure 4A:
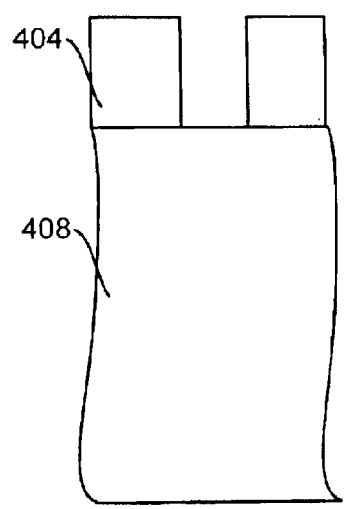
FIGS. 4A–F are schematic views of the formation of a contact hole using the inventive process.

To facilitate understanding, FIG. 3 is a flow chart of an embodiment of the invention. A photoresist mask is provided on a layer to be etched (step 304). FIGS. 4A–F are schematic illustrations of the process. FIG. 4A shows a photoresist mask 404, which has been provided on an oxide layer 408 to be etched, which is on a substrate. The substrate is placed in a process chamber (step 306).

Figure 5:
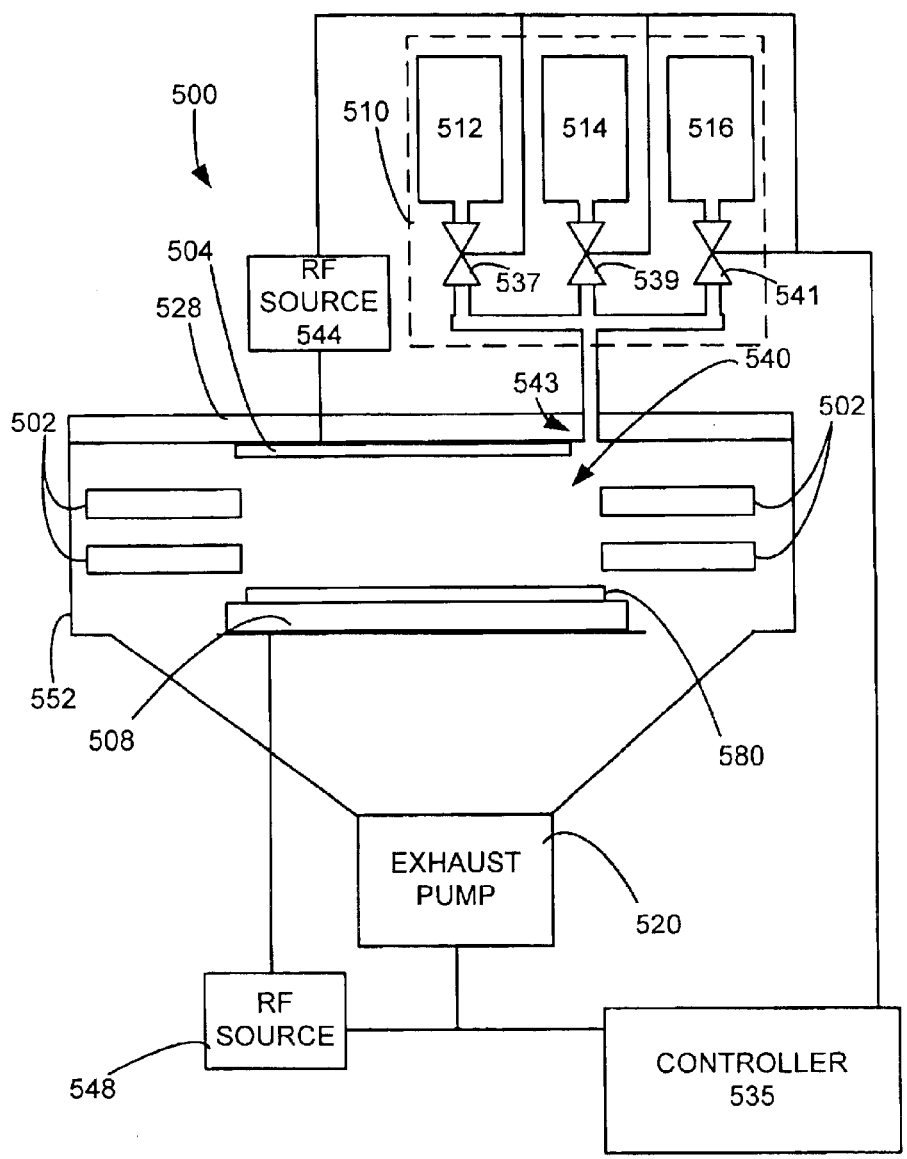
FIG. 5 is a schematic view of a system that may be used in practicing the invention.

FIG. 5 is a schematic view of a process chamber 500 that may be used in the preferred embodiment of the invention. In this embodiment, the plasma processing chamber 500 comprises confinement rings 502, an upper electrode 504, a lower electrode 508, a gas source 510, and an exhaust pump 520. The gas source 510 comprises a passivation gas source 512, an etchant gas source 514, and an additional gas source 516. Within plasma processing chamber 500, the substrate wafer 580, on which the oxide layer is deposited, is positioned upon the lower electrode 508. The lower electrode 508 incorporates a suitable substrate chucking mechanism (e.g., electrostatic, mechanical clamping, or the like) for holding the substrate wafer 580. The reactor top 528 incorporates the upper electrode 504 disposed immediately opposite the lower electrode 508. The upper electrode 504, lower electrode 508, and confinement rings 502 define the confined plasma volume 540. Gas is supplied to the confined plasma volume by gas source 510 through a gas inlet 543 and is exhausted from the confined plasma volume through the confinement rings 502 and an exhaust port by the exhaust pump 520. The exhaust pump 520 forms a gas outlet for the plasma processing chamber. A first RF source 544 is electrically connected to the upper electrode 504. A second RF source 548 is electrically connected to the lower electrode 508. Chamber walls 552 define a plasma enclosure in which the confinement rings 502, the upper electrode 504, and the lower electrode 508 are disposed. Both the first RF source 544 and the second RF source 548 may comprise a 27 MHz power source and a 2 MHz power source. Different combinations of connecting RF power to the electrode are possible. A modified Exelan 2300 DFC (Dual Frequency Confined) made by LAM Research Corporation™ of Fremont, California may be used in a preferred embodiment of the invention. A controller 535 is controllably connected to the first RF source 544, the second RF source 548, the exhaust pump 520, a first control valve 537 connected to the deposition gas source 512, a second control valve 539 connected to the etch gas source 514, and a third control valve 541 connected to the additional gas source 516. The gas inlet 543 provides gas from the gas sources 512, 514, 516 into the plasma processing enclosure. A showerhead may be connected to the gas inlet 543. The gas inlet 543 may be a single inlet for each gas source or a different inlet for each gas source or a plurality of inlets for each gas source or other possible combinations.

Figure 4B:
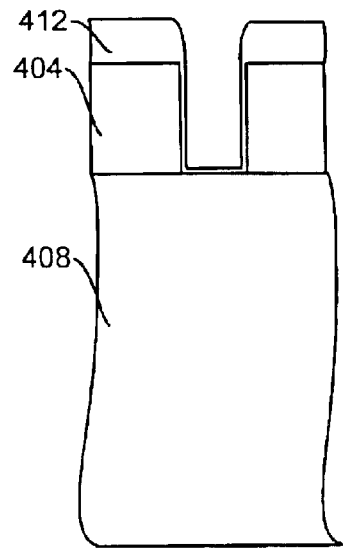

A protective layer 412 is formed on the photoresist mask 404, as shown in FIG. 4B (step 308). It is preferred that the deposition be asymmetric so that the amount of deposition is formed preferentially more on the masking material. It is preferred such a process is aided by the line-of-sight of the location to the deposition source as well as by the selective nature of the chosen CVD process. In other words, the deposition chemistry be chosen in such a way that a coating is formed preferentially on the masking materials due to differences in the chemical inertness of the materials. As can be seen in FIG. 4B a thicker protective layer 412 is formed on the top of the photoresist mask 404 than on the oxide surface on the bottom of the photoresist mask and on the sidewalls of the photoresist mask. In the preferred embodiment, the deposition is done in-situ in an etch chamber using a chemical vapor deposition (CVD) process, which also deposits a thin protective layer on the sidewall of the photoresist. Preferably the deposition uses some ion energy to allow for selectivity of such deposition.

In other embodiments, the processing conditions may be changed to vary the thickness and spatial distribution of the protective layer. For example, it may be desirable to form a thicker coating on the sidewall of the etching structures as the etching proceeds deeper in order to protect the etching structure from further distortion by the subsequent etching. A variation of processing conditions may provide for this. Since passivation and etching are separate steps, the process conditions for passivation may be optimized for this result without interfering with the etching process.

During the deposition, the fluorine-to-carbon ratio of the deposition gas is not greater than 2:1. Examples of deposition chemistries that may be used for CVD may be, but are not limited to, $CH_3F$, $CH_2F_2$, $C_2H_5F$, $C_3H_7F$, $C_2H_3F$, $CH_4$, $C_2H_4$, $C_2H_6$, $C_2H_2$, $C_3H_8$, and $SiH_4$, $Si(CH_3)_4$, $Si(C_2H_5)_4$. It is preferred that these chemicals are halogen free or have a halogen to carbon ratio of no greater than 2:1. Without being limited by theory, it is believed that the carbon based chemistry forms a thin etch resistant amorphous carbon layer. The silane $SiH_4$ would be used to form an amorphous silicon layer (or polyamorphous silicon) over the photoresist. In addition, the protective layer may have been modified with the presence of some F and H components. The presence of other elements, such as F, may be used to yield selective activity on different material surfaces such that deposition occurs preferentially on one but not the other materials, such as on the photoresist mask materials but not on $SiO_2$ layer, under appropriate ion bombardment. The thinness and etch resistance provides a protection sufficient to resist photoresist etch or damage and thin enough to allow etching of the desired feature shape. Other methods, such as sputtering, may be used to deposit a protective layer on the photoresist mask before etching. The passivation step is an independent step in the etch process which may include different combinations of deposition gases for different etching applications of different materials, where the deposition provides a protective coating around the etching features including the masking features using possible multistep gas switching sequences. To accomplish this step, the controller 535 may cause the first valve 537 to allow a deposition gas from the deposition gas source 512 into the process chamber 500, while causing the second valve 539 from preventing etching gas from the etchant gas source 514 from entering the process chamber. The controller 535 may also control the power supplied by the first and second RF sources 544, 548 and the exhaust pump 520. The controller may also be used to control the wafer pressure, backside He cooling pressure, the bias on the substrate, and various temperatures.

Table I is a table of some of the parameters that may be used in a passivation and etching step in the preferred embodiment of the invention.

TABLE I

|  | Preferred Range | More Preferred Range | Most Preferred Range |
|---|---|---|---|
| Bias Voltage | >50 volts | >100 volts | >300 volts |
| Bias Energy | >50 eV | >100 eV | >300 eV |

The bias may be provided by placing a constant voltage between an upper electrode above the substrate and a lower electrode below the substrate. In the preferred embodiment, an electrical negativity can be formed on the substrate holding the wafer materials (thereby applying a bias to the wafer) by applying a radio frequency (RF) voltage supplied by an RF power generator. This has the effect of drawing the positively charged particles towards the electrically biased substrate at an energy determined by the electrical negativity controlled by the amplitude of the RF voltage. It is, therefore, possible to supply and vary the ion bombardment energy by controlling the RF power (and hence the RF voltage) applied to the substrate holder.

Figure 4C:
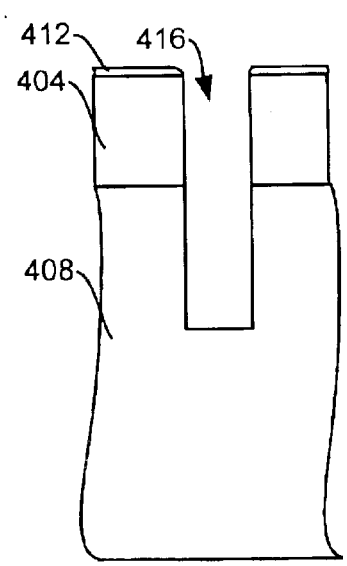

Next, the oxide layer 408 is etched through the photoresist mask 404, to form the trench 416, as shown in FIG. 4C. Etching applications may include, but are not limited to, a dielectric contact etch (high aspect ratio contact (HARC) or damascene), conductor trench etch (shallow or deep), self-aligned contact etch, gate mask open etch, contact etch, via dielectric etch, dual-damascene via etch, dual damascene trench etch, conductor gate etch, conductor deep trench etch, conductor shallow trench isolation etch, and hardmask opening. Preferably, the etch uses a high ion energy to provide a directional etch. The etch may remove some of the protective layer 412, as shown. All of the protective layer on some of the surfaces may be removed. In this example, the protective layer forming the side wall on the photoresist 404 has been removed. Other parts of the protective layer may only be partially removed. In this example, only part of the protective layer 412 on the top surface of the photoresist 404 has been removed. In other embodiments, other parts of the protective layer may be partially etched way or completely etched away. To accomplish this step, the controller 535 may cause the first valve 537 to stop the flow of the deposition gas from the deposition gas source 512 into the process chamber 500, while causing the second valve 539 to allow the etching gas from the etchant gas source 514 to flow into the process chamber. The controller 535 may change the power supplied by the first and second RF sources 544, 548 and change the setting of the exhaust pump 520 to accommodate the etching. The controller may also be used to change the wafer pressure, backside pressure, and various temperatures to accommodate the etching process. Since this etch step uses high energy ions to provide a directional etch, a polymer former gas is provided during the etch. The polymer former gases may be, for example, hydrocarbons, fluorocarbons, and hydrofluorocarbons, such as $C_4F_6$, $C_4F_8$, $CH_3F$, $CH_2F_2$, $CH_4$, $C_3F_6$, $C_3F_8$, and $CHF_3$. These polymer former gases would form a polymer layer that is constantly added and etched away during the etch.

Table II is a table of some of the parameters that may be used in an etching process in the preferred embodiment of the invention.

TABLE II

|  | Preferred Range | More Preferred Range | Most Preferred Range |
|---|---|---|---|
| Bias Voltage | >200 volts | >300 volts | >400 volts |
| Bias Energy | >200 eV | >300 eV | >400 eV |

Figure 4D:
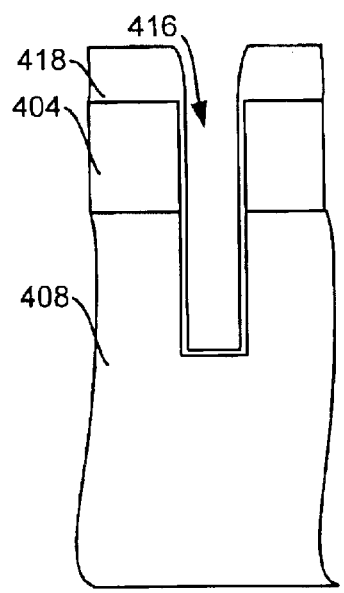

After the contact hole is at least partially etched, a determination is made on whether to etch more (step 316). This may be done by a set recipe or by taking a measurement. If more etching is desired, then the process cycles back to step 308, where an additional protective layer 418 is deposited on the photoresist mask, as shown in FIG. 4D. In this example, the remaining part of the old protective layer becomes part of the new protective layer 418. In this step, again the controller 535 opens the first control valve 537 to provide deposition gas and closes the second control valve 539 to stop the flow of the etching gas. The controller 535 may also change other parameters to accommodate the deposition.

Figure 4E:
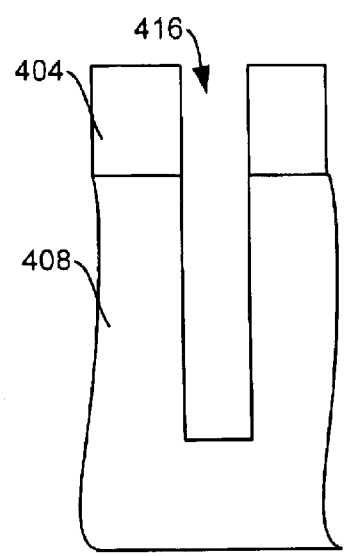

The contact hole is then further etched through the photoresist mask (step 312), providing a deeper contact hole 416, as shown in FIG. 4E. In this step, again the controller 535 closes the first control valve 537 to stop the deposition gas and opens the second control valve 539 to allow the flow of the etching gas. The controller 535 may also change other parameters to accommodate the etching.

Preferably, this cycle or loop of providing alternating deposition and etching steps is repeated more than once. Preferably, this cycle is repeated more than three times. Preferably, this cycle is repeated at least five times. This cycle may be repeated dozens of times. It may be desirable to repeat this cycle 100 times.

Figure 4F:
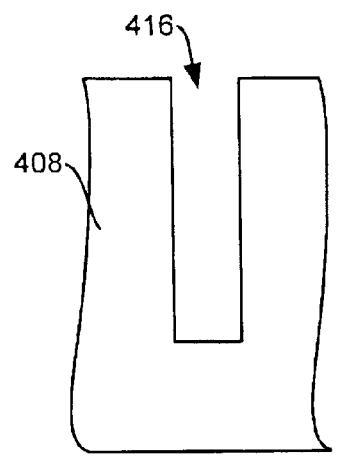

Preferably, in at least the last cycle, the etching step completely etches away the protective layer, as shown in FIG. 4E. When no further etching is desired, the photoresist mask is stripped (step 320) to yield the oxide layer 408 with a contact hole 416, as shown in FIG. 4F. The photoresist mask may be stripped in the process chamber 500 or after removal from the process chamber 500.

In other embodiments, an etch step may be added before step 308 for depositing a protective layer on the photoresist mask.

Preferably, the etching and the deposition of the protective layer are done in the same chamber, but may be done in different chambers. An Exelan, DFC 2300 made by LAM Research Corp. of Fremont, Calif. may be adapted to perform both the deposition and etch steps. Since the deposition and etch are done in the same chamber, cycling between the deposition and etch may be done quickly. Examples of materials for the photoresist mask may include, but are not limited to the newer generation of photoresist, such as, deep UV photoresist, 193 nm photoresist, 157 nm photoresist, EUV photoresist, e-beam photoresist, and x-ray photoresist. The older generation of photoresist polymer materials are designed to contained unsaturated C—C bonds, such as the C—C double bond and even C—C triple bonds to provide the required high etching resistance, namely, chemical inertness to the etching gas mixture. These bonds are strong and require a high activation energy to break and therefore, at relatively low ion energies, the older generation photoresist can show remarkably low etching rate to the etching gas mixture. The newer generation of photoresist, including 193 nm and 157 nm, does not contain these unsaturated bonds because these unsaturated bonds absorbs at the lithography exposure wavelength, leading to much reduced photoresist etching resistance. By providing a protective coating on the photoresist during the etching phase, using an etching mixture containing at least one passivation gas, the etching resistance of the photoresist is much improved, even at high ion bombardment energy. The high ion bombardment energies at which the invention may improve etching resistance of the photo resist may be 50–2,000 eV. More preferably the ion bombardment energy may be 200–1,500 eV. Most preferably the ion bombardment energy is 500–1,000 eV.

EXAMPLE

A specific example of the invention, for etching a $SiO_2$ layer with a 193 photoresist mask and a bottom antireflective coating (BARC) between the $SiO_2$ layer and the photoresist mask, uses an Exelan DFC 2300 for the process chamber 500. In the process chamber 500, a BARC etch is performed. The BARC etch has a pressure of 110 millitorr, which may be set by the confinement rings 502, the exhaust pump 520 and the flow rate through the gas inlet 543. The power applied at 27 MHz is 1200 watts, and no power at 2 MHz through the electrodes 504, 508. The etch chemistry is 700 sccm of Argon, 60 sccm of $CF_4$, and 12 sccm of $O_2$. The upper electrode 504 is placed at a temperature of 180° C. The chuck formed by the lower electrode 508 is placed at a temperature of 10° C. A backside inner zone chuck pressure of helium is placed at 15 torr. A backside outer zone chuck pressure is placed at 15 torr. In this example, the BARC etch is maintained for 50 seconds. The controller 535 controls these parameters. The additional gas source 516 may be used to provide gases for the BARC etch. The additional gas source 516 may represent more than one gas source. The third valve 541 may represent more than one valve, so that the additional gases may be independently controlled by the controller 535. For an Exelan DFC 2300, a back side pressure of helium is used to cool the chuck. The Exelan DFC 2300 allows for an inner backside pressure, which is closer to the center of the chuck and an outer backside pressure which is closer to the outer edge of the chuck. The controller 535 is able to control these pressures.

A deposition of the protective layer is performed in the Exelan DFC 2300 at a pressure of 50 millitorr, with 800 watts applied at 27 MHz and 400 watts applied at 2 MHz. The deposition chemistry is 500 sccm of Argon and 50 sccm of $CH_3F$. The upper electrode is placed at a temperature of 180° C. The chuck is placed at a temperature of 10° C. The backside inner zone chuck pressure of helium is placed at 30 torr. The backside outer zone chuck pressure is placed at 12 torr. In this example, the deposition gas source 512 would provide the $CH_3F$, which is not provided during the etching. The argon may be provided from the additional gas source 516, since argon is provided during both the deposition and etching. The controller 535 would open the first valve 537 and close the second valve 539. The controller would also control the flow of argon from the additional gas source. The controller 535 would control the power and other parameters as specified above.

An etching of the $SiO_2$ layer is performed in the Exelan DFC 2300 at a pressure of 40 millitorr, with 2500 watts applied at 27 MHz and 3500 watts applied at 2 MHz. The etch chemistry is 400 sccm of Argon, 36 sccm of $C_4F_6$, and 30 sccm of $O_2$. The $C_4F_6$ would be a polymer former gas, which provides polymerization during the etching. The $O_2$ would be the etching enabler gas. Although the fluorine from $C_4F_6$ is used in etching, the fluorine in this example requires the presence of oxygen to enable etching. The upper electrode is placed at a temperature of 180° C. A chuck is placed at a temperature of 10° C. A backside inner zone chuck pressure of helium is placed at 30 torr. A backside outer zone chuck pressure is placed at 12 torr. In this example, the etchant gas source 514 would provide the $C_4F_6$ and $O_2$, which is not provided during the deposition, although $C_4F_6$ without oxygen may be used during deposition The controller 535 would close the first valve 537 and open the second valve 539. The controller would also control the flow of argon from the additional gas source. The controller 535 would control the power and other parameters as specified above.

In this example, first the BARC etch is performed for 50 seconds. Next, the deposition of the protective layer (step 308) is performed for 10 seconds. Next, the contact hole is etched for 25 seconds (step 312). Then the deposition of the protective layer is performed for 10 seconds (step 308). The etch of the trench for 25 seconds (step 312) and the deposition of the protective layer for 10 seconds (step 308) is repeated four times. A final etch of the trench is performed for 80 seconds (step 312). The cycle is completed (step 316) and the photoresist is stripped (step 320). Therefore, in this example, the deposition (step 308) and etch (step 312) cycle is performed for 5 cycles.

Another notation for this same sequence can be written as:

50 sec. BARC etch+10 sec. deposition+4×(25 sec. etch+10 sec. deposition)+80 sec. etch.

In this example, the protective layer is preferentially formed on the mask and sidewalls of the feature, so that the protective layer is thicker on the mask and sidewalls of the feature than on the bottom of the feature or that no protective layer is formed at all at the bottom of the feature.

Figure 6:
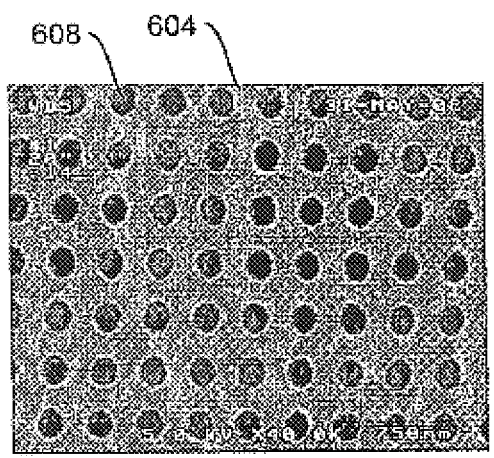
FIG. 6 is a micrograph of a plurality of high aspect ratio contact hole patterns formed using the invention.
Figure 7:
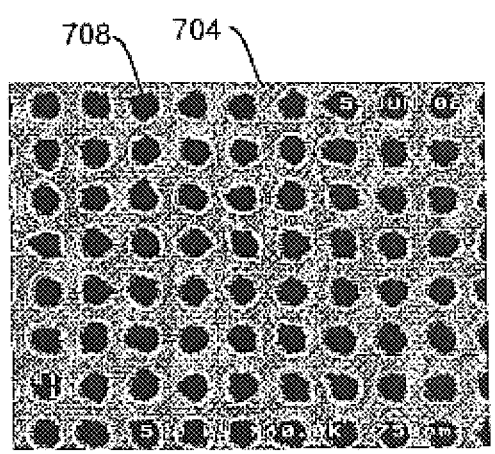
FIG. 7 is a micrograph of a plurality of high aspect ratio contact hole patterns formed using a prior art process.

Different conditions may be used between cycles to more specifically tailor the conditions to the process. Additional processes may be added to each cycle. Although in this example the process chamber is an Exelan DFC 2300, other modified etching systems may be used. FIG. 6 is a photomicrograph of a $SiO_2$ layer 604, which was masked with a 193 photoresist mask to form high aspect ratio contact (HARC) etches 608, using the inventive deposition of a protective layer and etch process. FIG. 7 is a photomicrograph of a $SiO_2$ layer 704, which was masked with a 193 photoresist mask to form high aspect ratio contact (HARC) etches 708, without using the inventive deposition of a protective layer and etch process. As can be seen by comparing FIG. 6 and FIG. 7, the inventive process of deposition and etching provides the desired pattern transfer from the photoresist mask (the original mask patterns are arrays of circular holes) in that the contacts are more circular. On the other hand, the prior art method of an etch without the deposition of a protective layer for the photoresist causes a distortion of the original patterns, which is apparent in the dielectric layer as shown by the more irregular shape of the contact holes and which is not acceptable. The protective layer on the sidewalls of the photoresist and trench may also prevent striation, that is found in some etch processes.

The invention provides a more cost effective process than the use of a stacked mask, since the production of a stacked photoresist mask is more complicated. The invention may also provide better etch results at less expense than a stacked mask process.

The layer to be etched may be a dielectric layer (such as silicon oxide), a conductive layer (such as metal and silicon or other type of semiconductors), or a hardmask layer (such as silicon nitride and silicon oxynitride). For etching a conductor layer, halogens, such as chlorine, fluorine, or bromine, may be used in the etching step, where the deposition may contain chemicals used to deposit a C-rich thin film or a thin film containing Si.

In the preferred embodiment of the invention, it is desirable that some of the components of the deposition gas are not mixed with components of the etch gas, since some mixing decreases the efficiency of having a separate deposition and etch process. As a result, the controller should time the gas flows so that one gas is depleted before another gas is added.

In the preferred embodiment, the etchant gas from the etching gas source is not provided to the plasma processing chamber during the deposition step and the deposition gas from the deposition gas source is not provided to the plasma processing chamber during the etching step. This may be done by not providing a component of the etching gas or deposition gas. For example, oxygen or an oxygen containing gas is a key etching component to an etching gas. Even though $C_4F_6$ is also used in the etchant gas, etching cannot be accomplished by $C_4F_6$ without oxygen in this example. So by not providing oxygen or an oxygen containing gas during the deposition step is a method of not providing the etching gas during the deposition step, even if $C_4F_6$ is provided during deposition. It is also preferred that the deposition process is a non-etching or negligently etching at most (comprising less than 10% of the layer to be etched) for forming the protective coating. Such a deposition process may be, but is not limited to, CVD deposition or sputtering, since CVD and sputtering are not used for etching. If the deposition gas is the same as the polymer former in the etch step, then the deposition gas may be provided during the etch step. In such a case, one difference between the deposition step and the etch step is that an etching component of the etch gas is present only during the etch step. In addition, bias power during the etch step may be higher to provide the directional etching.

Providing a separate deposition step and the presence of the polymer former to provide polymerization during the etch step allows the use of higher energy etching ions for higher etching rate and better anisotropic etching..

By keeping passivation gases in an etching mixture, it is possible to use higher ion energies without unacceptable erosion and damage of the etching mask. Additionally, anisotropic etching can be achieved during the duration of the etching step. By using separate passivation steps, profile and mask protection can be optimized by choosing, for example, a passivation chemical mixture that forms a harder and more durable coating than produced by an etching mixture, since the inter-reaction of etching and retardation gases in the discharge can degrade the quality of the coating. Additionally, the passivation chemistry conditions, such as pressure and concentration, may be tailored to optimize the properties of the passivation coating such as the composition, thickness.

Therefore, by having independent passivation and etch-passivation steps processing conditions, such as temperature, power, pressure, ion energy, and processing gases, may be independently controlled varied to provide optimal conditions for each step to provide an optimized coating and an optimized etch.

Other inert gases instead of argon may be used as carrier gases during both the etching and deposition. An example of another inert gas would be neon.

In an embodiment of the invention, the chamber wall areas, which may contact the plasma (a mixture of chemicals and charged particles sustained by the electrical discharge), are made to be as small as possible and to be maintained at elevated temperatures. The object of this is to minimize the total deposition on the chamber wall areas so as to avoid the so-called "memory" effect, by which the chemical elements contained in the coating of the chamber wall areas formed in one processing step can be released to interfere with the subsequent steps.

It may also be desirable that the gas travel time from the precursor source to the processing chamber is made to be very short. The gas flow stability time, denoting the time to establish a constant desired flow and the time to establish complete absence of the said gas at the processing chamber, is made to be very short so that the transition from one stable gas mixture composition to the next can be made to be very fast. The object of this is to avoid inter-mixing of chemicals between two different steps, which can degrade the performance.

It may also be desirable that the electrical system and the control network controlling the conversion of the electrical power into an electrical discharge reacts very fast with respect to the changes of the discharge conditions and power requirements. Furthermore, it may desirable to be able to quickly change and stabilize other t external conditions of the processing chamber, such as the pressure of the gas mixture and the temperature of the wafer substrate. Since the two different steps may be repeated a large number of times process conditions to accommodate each step must be change several times. Allowing such process conditions to be changed quickly allows for a faster cycling time and allows the process conditions to be varied significantly between steps to optimize each step individually. Therefore, it may also be desirable to have a central computerized system that is able to control and synchronize the rapid changing of the processing conditions. The computer is used to send commands for the required changes and synchronize with a predetermined time delays of various devices providing the plurality of condition changes in the processing chamber.

The deposition step may comprise a series of different coating steps. The etching step may comprise a series of different etching steps.

Figure 8A:
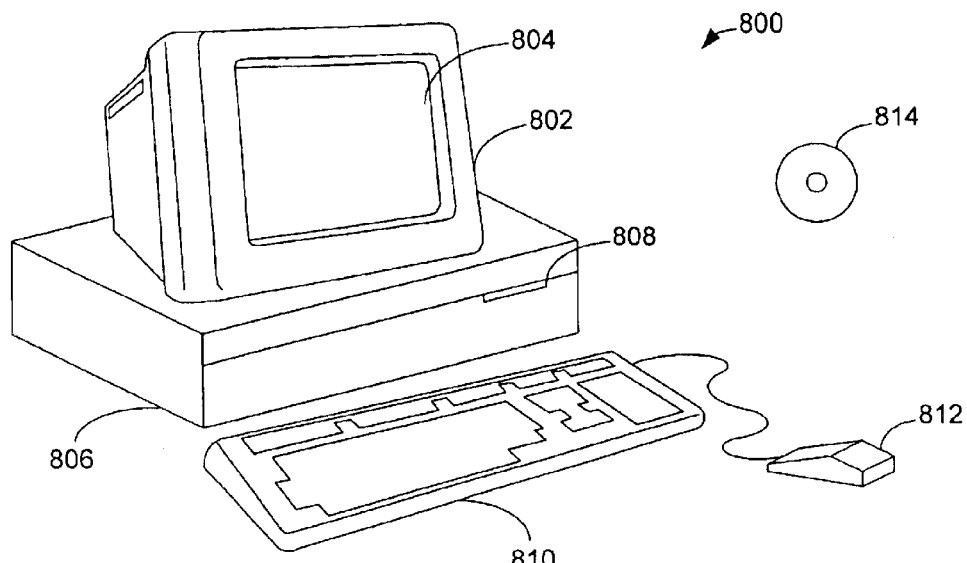
FIGS. 8A–B are schematic views of a computer system that may be used in practicing the invention.
Figure 8B:
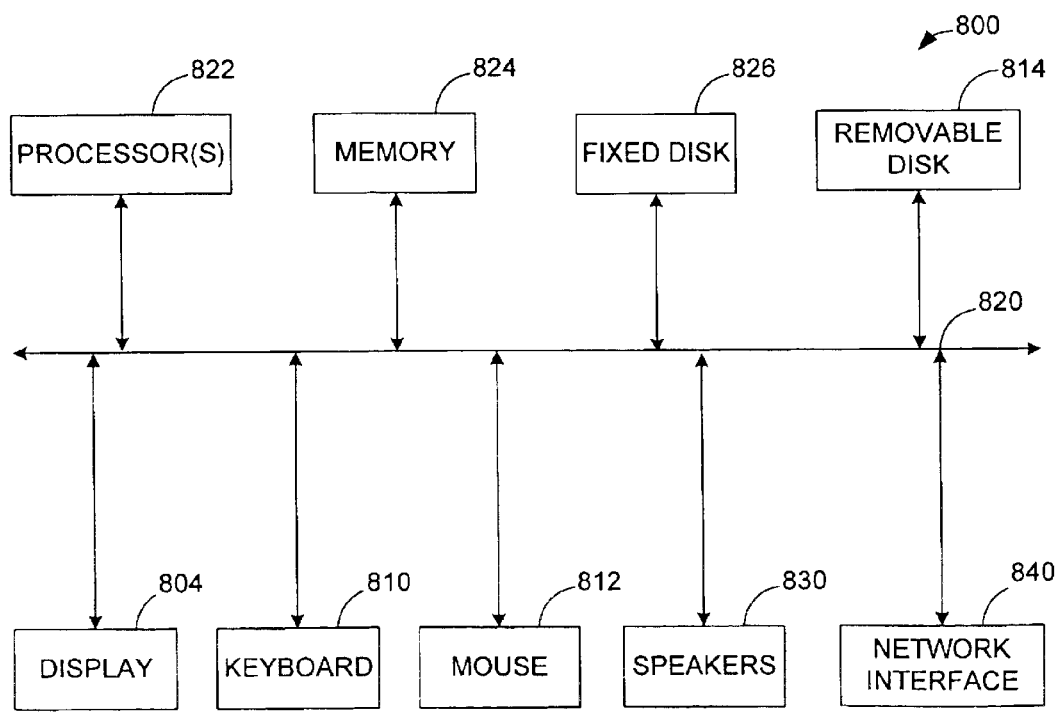

FIGS. 8A and 8B illustrate a computer system 800, which is suitable for using as the controller 535. FIG. 8A shows one possible physical form of a computer system that may be used for the controller 535. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 8B is an example of a block diagram for computer system 800. Attached to system bus 820 are a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable type of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 may be also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps. Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching a feature in a layer through an etching mask comprising:

forming a protective coating on exposed surfaces of the etching mask and vertical sidewalls of the feature with a passivation gas mixture; and etching the feature through the etching mask with reactive etching mixtures containing at least one etching chemical and at least one passivation chemical, wherein the forming the protective coating provides no protective coating on a bottom of the feature.

2. The method, as recited in claim 1, wherein the etching comprises providing an ion bombardment energy of greater than 200 electron volts to the substrate.

3. The method, as recited in claim 2, wherein the etching chemical contains a polymer former and an etch enabler.

4. The method, as recited in claim 3, wherein the passivation and etching are performed in a common plasma processing chamber.

5. The method, as recited in claim 4, wherein the deposition uses a non-directional deposition and the etching step uses a directional etching.

6. The method, as recited in claim 5, wherein the passivation is a non-etching or a negligibly etching deposition.

7. The method, as recited in claim 6, wherein the deposition process is selected from at least one of chemical vapor deposition and sputtering.

8. The method, as recited in claim 7, wherein the layer is only a single layer, wherein the feature is etched only in the single layer during the forming the protective coating and etching the feature, wherein the forming the protective layer and etching are performed in a sequentially alternating fashion at least four times, to etch only the single layer.

9. The method, as recited in claim 1, wherein the etching mask is a photoresist mask 193 nm or below generation.

10. The method, as recited in claim 1, wherein at least one passivation chemical releases a polymerizing agent that is more chemically active to the layer than the mask materials.

11. The method, as recited in claim 10, wherein at least one passivation chemical is a hydrofluorocarbon with F:C ratio of less than 2:1.

12. The method, as recited in claim 10, wherein at least one of the passivation chemical is one of the $CH_3F$, $CH_2F_2$, $C_2H_5F$, $C_2H_4F_2$, $C_3H_7F$, $C_3H_6F_2$, $C_2H_3F$, $CH_4$, $C_2H_6$, $C_2H_4$, $C_3H_8$, $C_2H_2$.

13. The method, as recited in claim 10, wherein the at least one passivation chemical is a mixture of Ar and $CH_3F$.

14. The method, as recited in claim 10, wherein the ion energy provided in the passivation step is greater than 100 electron volts.

15. The method, as recited in claim 1, wherein the layer is only a single layer, wherein the feature is etched only in the single layer during the forming the protective coating and etching the feature.

16. The method, as recited in claim 1, wherein forming the protective coating is accomplished using a selective chemical vapor deposition, which forms the protective coating on exposed surfaces of the etch mask and vertical sidewalls of the feature, but not on the bottom of the feature.

17. The method, as recited in claim 1, wherein the etch mask is a photoresist mask, and wherein the forming a protective coating forms a protective coating that is more etch resistant than the etch mask.

18. The method, as recited in claim 17, wherein the forming the protective coating forms a protective coating of amorphous carbon.

19. The method, as recited in claim 17, wherein the forming the protective coating forms a protective coating of polyamorphous silicon.

20. The method, as recited in claim 17, wherein the forming the protective coating forms a pseudo hardmask.

* * * * *